United States Patent
Graefling

(10) Patent No.: US 7,443,178 B2
(45) Date of Patent: Oct. 28, 2008

(54) CIRCUIT ARRANGEMENT OF THE TEMPERATURE COMPENSATION OF A MEASURING RESISTOR STRUCTURE

(75) Inventor: Martin Graefling, Graz (AU)

(73) Assignee: Infineon Technologies AG, Munich (DE)

(*) Notice: Subject to any disclaimer, the term of this patent is extended or adjusted under 35 U.S.C. 154(b) by 24 days.

(21) Appl. No.: 11/588,869

(22) Filed: Oct. 27, 2006

(65) Prior Publication Data

US 2007/0115009 A1    May 24, 2007

(30) Foreign Application Priority Data

Oct. 28, 2005    (DE)    ........................ 10 2005 051 848

(51) Int. Cl.
*G01R 27/08* (2006.01)
*H01H 47/00* (2006.01)

(52) U.S. Cl. ...................................... 324/721; 361/140

(58) Field of Classification Search ................. 324/721, 324/720, 691, 649, 600, 71.1, 105, 76.11; 361/139, 140, 160, 161, 165, 23–25, 27; 123/568.31; 73/765, 777; 307/651; 702/64, 702/132

See application file for complete search history.

(56) References Cited

U.S. PATENT DOCUMENTS

| | | | | | |
|---|---|---|---|---|---|
| 4,910,455 | A | * | 3/1990 | Nadd | ...................... 324/123 R |
| 5,146,907 | A | * | 9/1992 | Sawazaki et al. | ............ 123/644 |
| 5,426,416 | A | | 6/1995 | Jefferies et al. | |
| 5,825,234 | A | * | 10/1998 | Sung et al. | ................... 327/378 |
| 6,304,824 | B1 | * | 10/2001 | Bausch et al. | ................. 702/64 |
| 6,313,977 | B1 | * | 11/2001 | Hauer | ......................... 361/140 |
| 6,937,028 | B2 | * | 8/2005 | Tan | .............................. 324/601 |
| 6,973,837 | B2 | * | 12/2005 | Barnett | ........................ 73/765 |
| 2004/0024561 | A1 | | 2/2004 | Huckaby et al. | |
| 2005/0162160 | A1 | | 7/2005 | Ausserlechner et al. | |

FOREIGN PATENT DOCUMENTS

| | | |
|---|---|---|
| DE | 4223338 A1 | 1/1994 |
| DE | 19750993 A1 | 5/1999 |
| DE | 19908635 A1 | 9/2000 |
| EP | 1023773 B1 | 1/2002 |
| WO | WO 99/21279 | 4/1999 |

OTHER PUBLICATIONS http://www.wordwebonline.com/search.pl?w=parallel+connection.*
http://www.wordwebonline.com/search.pl?w=equivalent+circuit.*

* cited by examiner

*Primary Examiner*—Diego Gutierrez
*Assistant Examiner*—Hoai-An D Nguyen
(74) *Attorney, Agent, or Firm*—Maginot, Moore & Beck

(57) ABSTRACT

An electrical circuit for the temperature compensation of at least one measuring resistor structure integrated in a semiconductor body includes at least one further resistor structure which is likewise concomitantly integrated into the semiconductor body and is thermally coupled to the measuring resistor structure. The electrical circuit also includes a circuit arrangement which is electrically connected to the further resistor structure, feeds a current into the further resistor structure, and evaluates a temperature-dependent voltage dropped across the further resistor structure as a result. The temperature-dependent voltage dropped across the further resistor is used for temperature compensation of the measuring resistor structure.

16 Claims, 2 Drawing Sheets

CIRCUIT ARRANGEMENT OF THE TEMPERATURE COMPENSATION OF A MEASURING RESISTOR STRUCTURE

CROSS-REFERENCE TO RELATED APPLICATIONS

The present application claims priority from German patent application no 10 2005 051 848.6-33, filed Oct. 28, 2005, the contents of which are incorporated herein by reference.

FIELD

The invention relates to the field of temperature compensation of a measuring resistor structure, and particularly a measuring resistor structure integrated into a semiconductor body.

BACKGROUND

Measuring resistors such as are used in arrangements for measuring currents, for example, are resistors which are connected in series into the electric circuit to be measured, the voltage dropped across said measuring resistor being used for determining the current intensity. In this case, with regard to precision, stringent requirements are made of measuring resistors, that is to say of the absolute accuracy of the resistance and the greatest possible independence with respect to temperature fluctuations. Both factors have a significant influence on the obtainable measuring accuracy of the current measuring arrangements.

These requirements constitute the major reason why measuring resistors in circuit arrangements for current measurement according to the prior art are predominantly embodied as discrete, external components. Alongside the absolute accuracy of the resistance which can be controlled very well in the case of discrete components, a low temperature dependence can also be achieved here by suitable selection of the materials, the construction and the production technology. The temperature dependence of a component is described by the temperature coefficient, which specifies the temperature drift per 1 kelvin. The unit ppm/K is customary in this case. A normal discrete metal film resistor has a temperature coefficient of 100 ppm/K, that is to say that it changes its resistance by 0.01% (100 ppm) for a temperature change of 1 kelvin. Discrete precision resistors, by contrast, drift only by a value of 25 ppm/K. The sensitivity of precision measuring devices to disturbing temperature influences should nevertheless be significantly reduced further by suitable active temperature correction of said precision measuring devices.

The continuously advancing demand for integration of components into semiconductor bodies with a small area requirement also relates to the integration of measuring resistors in semiconductor circuit arrangements for measuring the current intensity. The above-described factors of the absolute accuracy of the resistance and the greatest possible independence with respect to temperature fluctuations constitute the major challenges in this case, too. Due to the embodiment as a resistor structure in an integrated semiconductor body and the associated production-technological tolerances and also the temperature coefficients based on the material properties (silicon) used, in this case it is not possible, however, to achieve the precision with regard to resistance and temperature coefficient as known from discrete, external components.

In order to obtain the desired absolute accuracy of the resistance of a resistor structure integrated into a semiconductor body, it is known to integrate so-called laser fuses into said resistor structure in the production process. These are interruptible connection bridges in the resistor structure of the semiconductor body, which are severed in a targeted manner in order to obtain a precise adjustment of the resistor structure to the desired resistance. This is effected for example by the energy of a pulsed laser, for example a Neodymian YAG laser, which melts the metal track of the fuse arrangement locally, that is to say in a typical width of 2 to approximately 5 μm, and interrupts it in this way.

However, the temperature coefficient of such a resistor structure integrated into a semiconductor body according to the prior art is still subject to the production-technological tolerances and material properties inherent in the creation of semiconductor bodies and can influence the desired measurement results in an impermissible manner.

SUMMARY

It is an advantage of at least one embodiment of the present invention to provide a circuit arrangement comprising a resistor structure concomitantly integrated into the semiconductor body in the case of which the abovementioned problems do not occur.

Such an advantage is achieved in one embodiment by means of a circuit arrangement for the temperature compensation of at least one measuring resistor structure integrated in a semiconductor body, comprising at least one further resistor structure which is likewise concomitantly integrated into the semiconductor body and is thermally coupled to the measuring resistor structure and a circuit arrangement which is electrically connected to the further resistor structure, feeds a current into the further resistor structure and evaluates a temperature-dependent voltage dropped across the further resistor structure as a result, said voltage being provided for the temperature compensation of the measuring resistor structure.

The advantageous effect of the at least one embodiment of the invention is based on the general property of integrated circuits that resistor structures can be produced with very low relative deviations of the characteristic values (matching) owing to the virtually identical starting material and on account of production in one and the same process. This exploits the circumstance that the component structures have virtually the same temperature owing to their small extent and their close proximity in the semiconductor body and, consequently, changes in the characteristic values on account of temperature changes, in the present case those of the resistor structures of the measuring resistor that are connected in parallel and those of the additionally integrated resistor structures that are connected in series, have an identical profile. On this basis, the temperature drift of the measuring resistor can be ideally completely compensated for by suitable evaluation of the temperature dependence of the additional resistor structures connected in series.

In addition to the above, further advantages may also arise from the fact that for multichannel applications for current measurement, all the requisite resistor structures of the various measuring resistors and the associated resistor structures arranged in a manner interleaved spatially on the substrate of the semiconductor body, for temperature correction, are realized as semiconductor circuits and cost advantages arise in comparison with the use of discrete precision resistors, and that the temperature information can be incorporated into the measured value acquisition in averaged or unaveraged fashion.

The above described features and advantages, as well as others, will become more readily apparent to those of ordinary skill in the art by reference to the following detailed description and accompanying drawings.

DESCRIPTION

Figure 1:
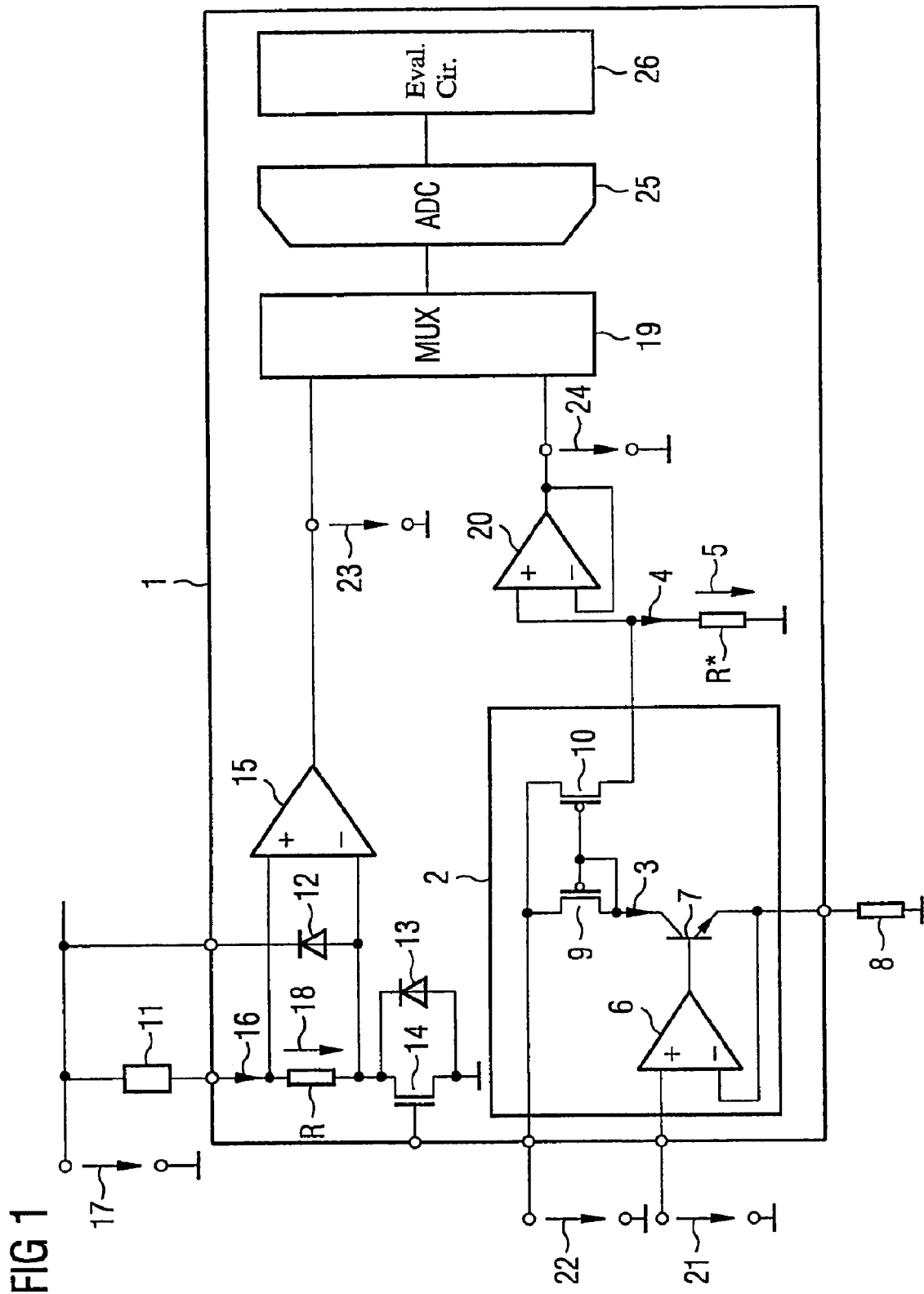
FIG. 1 shows the circuit diagram of a measuring resistor integrated into a semiconductor body and of a further resistor which is additionally integrated into the semiconductor body and matches with regard to the characteristic values, and also the components for reciprocally evaluating the voltages at these two resistors.

A circuit arrangement according to at least one embodiment of the invention is shown in FIG. 1. The circuit arrangement comprises an arrangement integrated into a semiconductor body 1 and serving for measuring a current 16 through an external inductive load 11, comprising a measuring resistor structure R and a differential amplifier 15. Furthermore, a first diode structure 12 acting as a freewheeling diode for the inductive load 11, a first transistor structure 14 serving as an electronic switch, and a second diode structure 13 connected in parallel with the load path of the first transistor structure 14 furthermore provided in the semiconductor body 1. In this case, the measuring resistor structure R is connected in series with the load 11 and with the load path of the first transistor structure 14, with the result that the load current 16 flows through it. The voltage 18 dropped across the measuring resistor structure R is amplified by differential amplifier 15 and applied to an input of a multiplexer structure 19, which is likewise integrated in the semiconductor body 1.

Furthermore, the circuit arrangement according to FIG. 1 comprises a circuit 2 for generating a constant current 3 comprising a second differential amplifier 6, a second transistor structure 7, an internal or external bandgap circuit (not shown) for generating a reference voltage 21 and also a third 9 and fourth 10 transistor structure connected up to form a current mirror with respect to a supply voltage 22 and serving for mirroring the current 3 into the current 4. Moreover, the circuit arrangement comprises a precision resistor 8, which is not integrated into the semiconductor body 1 and so is external, in the load circuit of the circuit 2, which together with the reference voltage 21 determines the current 3 in such a way that the current 3 is equal to the ratio of reference voltage 21 to the value of the resistor 8. The current 4 in the fixed ratio to the current 3 flows through the resistor structure R*, which is coordinated with the measuring resistor structure R, to ground. The voltage 5 dropped across said resistor structure R* is buffered by means of a third differential amplifier 20 and switched to one input of a multiplexer 19, the other input of which is connected to the output of the first differential amplifier 15. The multiplexer 19 is followed by an analog-to-digital converter 25 (ADC) and an evaluation circuit 26.

In detail, in the case of the circuit 2, the noninverting input of the differential amplifier 6 is connected to a stabilized reference voltage 21 and the output of the differential amplifier 6 is connected to the gate terminal of the second transistor structure 7. Furthermore, the source terminal of the second transistor structure 7 is connected to the inverting input of the differential amplifier 6 and, via the external precision resistor 8, to ground, as a result of which the constant current 3 is generated which flows through the external precision resistor 8. The two drain terminals of the third transistor structure 9 and the fourth transistor structure 10 are connected to the supply voltage 22, the gate terminal of the third transistor structure 9 being connected to the gate terminal of the fourth transistor structure 10 and to the source terminal of the third transistor structure 9. The source terminal of the fourth transistor structure 10 is coupled to ground via the resistor structure R*. In this case, the further resistor structure R* is coordinated with the measuring resistor structure R in such a way that it has the same temperature coefficient and thus maps all temperature-dictated resistance changes of the measuring resistor structure R.

For taking account of the temperature dependence of the resistance of the measuring resistor structure R, the voltages 23 and 24 from the differential amplifier 15 and 20, respectively, which voltages are present at the inputs of the multiplexer structure 19 in accordance with the circuit arrangement as shown in FIG. 1, are evaluated. In this case, the voltage 18 dropped across the measuring resistor structure R and amplified by the differential amplifier 15 (producing the voltage 23) initially represents a measure of the load current 16 that is to be measured and flows via said measuring resistor structure R, but without compensation of the undesirable temperature dependence of the measuring resistor structure R. Alternately to this voltage 23, via the further input of the multiplexer structure 19, the voltage 24 dropped across the further resistor structure R* is fed to the downstream analog-to-digital converter 25 (ADC) for conversion into a digital signal, said voltage 24 being generated by the differential amplifier 20 connected as an impedance converter (buffer) at the noninverting input of which differential amplifier the voltage 5 is present, which voltage is equal to the product of the resistance of the resistor structure R* and the constant current 4 produced from the current mirroring. The change in said voltage 24 depending on the temperature (change in the resistance of the resistor structure R*) is a measure of the change in the voltage 18 initiated by temperature change and accordingly the change in the resistance of the resistor structure R*. Since the resistances of the further resistor R* and of the measuring resistor structure R, according to at least one embodiment of the invention, have the same temperature coefficient and are exposed to the same temperature, the temperature-dictated change in the voltage 24 is a measure of the temperature-dictated change in the voltage 23.

In this way, in the evaluation circuit 26, connected downstream of the analog-to-digital converter 25 (ADC), the temperature dependence of the resistance of the measuring resistor structure R can be derived from the temperature dependence of the resistance of the further resistor structure R* and be taken into account—in averaged or unaveraged fashion—as a corresponding correction value in the measurement of the current 16.

The outlined method and the circuit arrangement according to FIG. 1 presuppose for the function according to at least one embodiment of the invention that the measuring resistor structure R and the resistor structure R* additionally integrated into the semiconductor body 1 essentially have the same temperature in all operating states and behave identically in the event of temperature changes.

Figure 2:
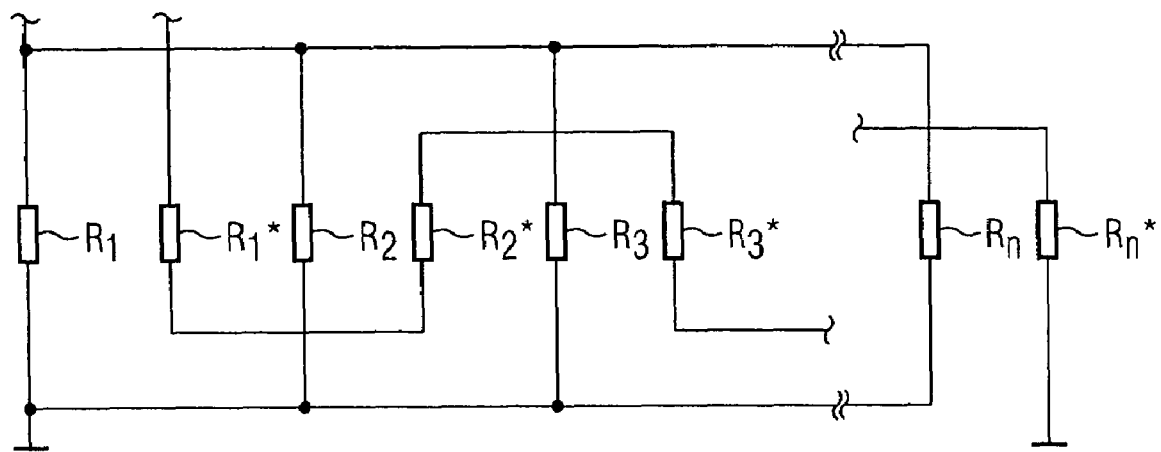
FIG. 2 shows the detail circuit diagram and the arrangement of the multiplicity of resistor structures for forming a measuring resistor and a matching further resistor additionally integrated into the semiconductor body.

These demands are met for example by the circuit arrangement according to FIG. 2. FIG. 2 shows the configuration of the two resistor structures R and R* in detail. In this case, the measuring resistor structure R is embodied by a multiplicity n of individual resistor structures $R_1$ to $R_n$, each having an identical resistance and connected in parallel. The identity of the absolute values of the resistances of the multiplicity n of resistor structures $R_1$ to $R_n$ connected in parallel is achieved by trimming the absolute values by means of laser fuses which are realized in the course of the production process for each individual one of said resistor structures $R_1$ to $R_n$. Connecting the multiplicity n of resistor structures $R_1$ to $R_n$ in parallel makes it possible to realize a sufficiently low total resistance for the measuring resistor structure R, such as is desired for a measuring resistor when measuring currents.

Furthermore, the resistor structure R* is embodied by a multiplicity n of individual (partial) resistor structures $R^*_1$ to $R^*_n$ each having an identical resistance which are connected in series. The identity of the absolute values of the resistances of the multiplicity n of resistor structures $R^*_1$ to $R^*_n$ connected in series is achieved by trimming the absolute values by means of laser fuses which are realized in the course of the production process for each individual one of said resistor structures $R^*_1$ to $R^*_n$. In this case, the absolute resistances of the resistor structures $R_1$ to $R_n$ and $R^*_1$ to $R^*_n$ are embodied with the same resistance not only within in each case the individual groups of the resistor structures connected in parallel and in series, respectively, but also from group to group, that is to say that, for example, resistance $R_1$ is equal to resistance $R^*_1$, resistance $R_2$ is equal to resistance $R^*_2$ through to resistance $R_n$ is equal to resistance $R^*_n$, and also resistances $R_{1...n}$ and resistances $R^*_{1...n}$ are identical.

What is achieved in this way is that a different area extent—governed by different resistances—of the resistor structures on the substrate of the semiconductor body does not lead to different temperature coefficients of the respective pair. The embodiment not only of individual pairs of the resistor structures with the same absolute resistance but of all partial structures associated with a respective resistor structure R and resistor structure R* is extremely advantageous for the function of the circuit arrangement and the evaluation of the voltage 5 dropped across the resistor structure R*. Furthermore, it also entails production-technological advantages since it is possible to produce identical structures in semiconductors with high relative precision.

Furthermore, the two resistor structures R and R* are preferably interleaved in one another by way of their partial structures on the semiconductor body in such a way that at least each individual pair of resistor structures $R_1$ and $R^*_1$, $R_2$ and $R^*_2$ to $R_n$ and $R^*_n$ is always arranged in the production-technologically greatest possible proximity to the other pairs. This exploits the circumstance that said resistor structures have the same temperature at any time owing to their small extent and their close proximity in the semiconductor body and, consequently, changes in the resistances on account of temperature changes have an identical profile. Preferably, not only the individual pairs of resistor structures are realized in the production-technologically greatest possible proximity to one another, but rather all the partial structures of resistor structure R and resistor structure R*, which, inter alia, entails all the partial structures being exposed to the same temperature in extremely uniform fashion and in turn also entails production-technological advantages.

If it is ensured by the above-described arrangement and embodiment of the resistances that each individual resistor structure $R^*_1$ to $R^*_n$ represents an accurate image (matching) of each individual resistor structure $R_1$ to $R_n$ with regard to its characteristic quantities such as, for instance, absolute resistance or temperature coefficient, the undesirable temperature drift due to the temperature-dependent change in the total resistance of the measuring resistor structure R can be simulated by the temperature drift due to the temperature-dependent change in the total resistance of the further resistor structure R*. In this case, the value of the change in voltage with impressed current 4 across the structure formed from a multiplicity n of individual further resistor structures $R^*_1$ to $R^*_n$ connected in series is a measure of the value by which the resistance of each individual resistor structure $R_1$ to $R_n$ of the measuring resistor structure R* changes over the temperature. This results specifically from total change in voltage across resistor structure $R^*_1$ to $R^*_n$ divided by number n of resistor structures divided by the impressed current 4.

With regard to the fact that each individual resistor structure $R^*_1$ to $R^*_n$ represents an accurate image of each individual resistor structure $R_1$ to $R_n$, the temperature-dictated change in the resistance of the measuring resistor structure R formed from a multiplicity n of individual resistor structures $R_1$ to $R_n$ connected in parallel can be calculated by the circuit arrangement for digital processing 26 and be used for the correction of the voltage value 18 dropped across said measuring resistor structure R and thus for the exact, temperature-independent measurement of the load current 16.

Since a plurality of constant currents can be derived from an individual reference current by a current mirror in a semiconductor body, in the present case for example by connecting a plurality of the series resistor structures R* in parallel, the solution described is also suitable for realizing, with otherwise identical external components (an individual precision resistor), multichannel measuring arrangements with temperature correction within a single semiconductor body.

While the invention disclosed herein has been described in terms of several preferred embodiments, there are numerous alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

What is claimed is:

1. An electrical circuit comprising:
   at least one measuring resistor structure integrated in a semiconductor body, the measuring resistor structure including a plurality of individual partial structures connected in parallel;
   at least one further resistor structure integrated in the semiconductor body and thermally coupled to the measuring resistor structure, the further resistor structure including a plurality of individual partial structures connected in series, wherein the plurality of individual partial structures connected in parallel are respectively arranged alongside the plurality of individual partial structures connected in series; and
   a circuit arrangement electrically connected to the further resistor structure and configured to feed a current to the further resistor structure and evaluate a temperature-dependent voltage dropped across the further resistor structure, wherein the temperature-dependent voltage provides a signal used for temperature compensation of the measuring resistor structure.

2. The electrical circuit of claim 1 wherein the plurality of individual partial structures connected in parallel are respectively arranged in a manner interleaved with the plurality of individual partial structures connected in series.

3. The electrical circuit of claim 1 wherein the number of individual partial structures connected in parallel is equal to the number of individual partial structures connected in series.

4. The electrical circuit of claim 1 wherein the plurality of individual partial structures connected in parallel each have the same resistance and wherein the plurality of individual partial structures connected in series each have the same resistance.

5. The electrical circuit of claim 1 wherein the plurality of individual partial structures connected in parallel and the respectively corresponding plurality of individual partial structures connected in series have the same resistance.

6. The electrical circuit of claim 1 wherein all of the individual partial structures are identical.

7. The electrical circuit of claim 1 wherein the current fed into the further resistor structure is temperature-independent.

8. The electrical circuit of claim 7 wherein the current fed into the further resistor structure is generated using an external precision resistor.

9. The electrical circuit of claim 1 wherein an evaluation circuit generates temperature data from the temperature-dependent voltage across the further resistor structure.

10. The electrical circuit of claim 9 wherein the evaluation circuit includes an analog-to-digital converter.

11. The electrical circuit of claim 9 wherein the evaluation circuit includes a digital signal processing unit.

12. The electrical circuit of claim 9 wherein the evaluation circuit averages the temperature data.

13. The electrical circuit of claim 9 wherein the evaluation circuit compensates the electrical resistance of the measuring resistor structure or the voltage across the measuring resistor structure depending on the temperature data.

14. A circuit arrangement comprising:
at least one measuring resistor structure integrated in a semiconductor body, the at least one measuring resistor structure including a plurality of individual partial structures connected in parallel;
at least one further resistor structure integrated in the semiconductor body and thermally coupled to the measuring resistor structure, the at least one further resistor structure including a plurality of individual partial structures connected in series, wherein the plurality of individual partial structures connected in parallel are respectively arranged alongside the plurality of individual partial structures connected in series;
a current generating circuit electrically connected to the further resistor structure and configured to deliver a constant current to the further resistor structure, the current resulting in a temperature-dependent voltage dropped across the further resistor structure; and
an evaluation circuit configured to evaluate the temperature-dependent voltage dropped across the further resistor structure and compensate for the temperature dependence of the resistance of the measuring resistor structure.

15. A circuit arrangement comprising:
at least one measuring resistor structure integrated in a semiconductor body, the at least one measuring resistor structure including a plurality of individual partial structures connected in parallel;
at least one further resistor structure integrated in the semiconductor body and thermally coupled to the measuring resistor structure, the at least one further resistor structure including a plurality of individual partial structures connected in series, wherein the plurality of individual partial structures connected in parallel are respectively arranged alongside the plurality of individual partial structures connected in series;
an electrical circuit connected to the further resistor structure and configured to apply a temperature-independent electrical parameter to the further resistor structure, application of the temperature-independent electrical parameter resulting in a temperature-dependent electrical parameter provided across the further resistor structure; and
an evaluation circuit configured to evaluate the temperature-dependent electrical parameter provided across the further resistor structure and compensate for the temperature dependence of the resistance of the measuring resistor structure.

16. The circuit arrangement of claim 15 wherein the temperature-independent electrical parameter is a current and the temperature-dependent electrical parameter is a voltage.

* * * * *